(12) United States Patent
Chhatre et al.

(10) Patent No.: US 8,844,106 B2
(45) Date of Patent: Sep. 30, 2014

(54) INSTALLATION FIXTURE FOR ELASTOMER BANDS AND METHODS OF USING THE SAME

(75) Inventors: Rish Chhatre, San Jose, CA (US); David Schaefer, Fremont, CA (US); Sung Lee, Pleasanton, CA (US); Dan Haber, Campbell, CA (US)

(73) Assignee: Lam Research Corporation, Fremont, CA (US)

( * ) Notice: Subject to any disclaimer, the term of this patent is extended or adjusted under 35 U.S.C. 154(b) by 134 days.

(21) Appl. No.: 13/293,972

(22) Filed: Nov. 10, 2011

(65) Prior Publication Data

US 2013/0117986 A1 May 16, 2013

(51) Int. Cl.
*B23P 11/02* (2006.01)
*H01L 21/67* (2006.01)

(52) U.S. Cl.
CPC .................................. *H01L 21/6719* (2013.01)
USPC .......................................................... 29/235

(58) Field of Classification Search
USPC .......... 269/903, 21, 289 R, 55; 451/285–288, 451/41; 29/235, 281.1
See application file for complete search history.

(56) References Cited

U.S. PATENT DOCUMENTS

| | | | |
|---|---|---|---|
| 6,090,304 A | | 7/2000 | Zhu et al. |
| 6,280,304 B1 * | | 8/2001 | Nakamura et al. ............ 451/261 |
| 6,346,038 B1 * | | 2/2002 | Kajiwara et al. .............. 451/339 |
| 6,379,230 B1 * | | 4/2002 | Hayashi et al. ............... 451/292 |
| 6,390,894 B1 * | | 5/2002 | Beel et al. ....................... 451/47 |
| 6,431,964 B1 * | | 8/2002 | Ishikawa et al. ................ 451/65 |
| 6,435,941 B1 * | | 8/2002 | White ................................ 451/5 |
| 7,431,788 B2 | | 10/2008 | Ricci et al. |
| 2006/0144516 A1 | | 7/2006 | Ricci et al. |
| 2009/0290145 A1 | | 11/2009 | Howard et al. |
| 2010/0078899 A1 | | 4/2010 | Povolny et al. |
| 2013/0117986 A1 * | | 5/2013 | Chhatre et al. ................. 29/428 |

OTHER PUBLICATIONS

Co-pending U.S. Appl. No. 13/277,873, filed Oct. 20, 2011.

* cited by examiner

*Primary Examiner* — Lee D Wilson
(74) *Attorney, Agent, or Firm* — Buchanan Ingersoll & Rooney PC

(57) ABSTRACT

A kit comprising an installation fixture, a plurality of mechanical fasteners and an embedding tool is provided which allows for an elastomer band to be disposed in a mounting groove around a semiconductor substrate support in a manner that relieves the internal stresses of the elastomer band, leading to an elastomer band with a longer operational lifetime. The installation fixture is secured to a substrate support with mechanical fasteners. An elastomer band is placed around an outer circumference of the installation fixture and rotated back and forth to relieve internal stresses of the elastomer band. The fixture is inverted and the elastomer band is slid vertically off the fixture and into the mounting groove. An embedding tool can be used to completely insert the elastomer band into the mounting groove.

20 Claims, 11 Drawing Sheets

INSTALLATION FIXTURE FOR ELASTOMER BANDS AND METHODS OF USING THE SAME

FIELD OF THE INVENTION

The present disclosure relates to an installation fixture for installing an elastomer band around a substrate support and methods of using the installation fixture.

BACKGROUND

Integrated semiconductor circuits have become the primary components of most electronics systems. These miniature electronic devices may contain thousands of the transistors and other circuits that make up the memory and logic subsystems of microcomputer central processing units and other integrated circuits. The low cost, high reliability and speed of these circuits have led them to become a ubiquitous feature of modern digital electronics.

The fabrication of integrated semiconductor circuits typically takes place in a reactive ion etching system, such as a parallel plate reactor or inductively coupled plasma reactor. A reactive ion etching system may consist of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, $HBr$, $Cl_2$ and $SF_6$ or mixtures thereof with $O_2$, $N_2$, $He$ or $Ar$ is introduced into the etching chamber and maintained at a pressure which is typically in the millitorr range. The upper electrode is provided with gas hole(s) which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched side walls.

Plasmas used for reactive ion etching are highly corrosive species and chamber component surfaces that are exposed to plasmas can degrade quickly. Such degradation of chamber components is costly and can lead to contamination of chamber components or to contamination of a substrate being processed in the chamber. Such degradation requires replacement of contaminated chamber components and/or cleaning of the contaminated chamber components. Such replacement and/or cleaning of the chamber components leads to downtime of the processing chamber.

A substrate support comprising an electrostatic chuck (ESC) for electrostatically clamping a substrate to the support is one such chamber component that may undergo degradation due to exposure to a plasma environment. These types of substrate supports typically comprise a number of components adhered to one another. For example, the support may comprise a cooling plate, a heater element and/or a ceramic plate bonded to one another by a suitable adhesive. To minimize degradation from exposure to the plasma environment, it is common to place an elastomer band around these components in order to protect the adhesive from direct exposure to the plasma environment, such as described in commonly-owned U.S. Pat. No. 7,431,788. However, the elastomer band is then directly exposed to the plasma environment and suffers degradation therefrom. The elastomer band also suffers degradation from compression forces under operational conditions.

The manner in which an elastomer band is disposed around a substrate support may also yield localized stresses in the elastomer band, which leads to the elastomer band being further susceptible to degradation from exposure to the plasma environment. Typically, an elastomer band is disposed around a substrate support by hand in a 5-point star-shaped pattern. Such a disposal pattern creates highly localized stress areas in the elastomer, which are weaker areas in the elastomer and subjects these areas to greater mass loss when exposed to a plasma environment, usually leading to cracking of the elastomer.

Thus, there is a need for an improved method of installing an elastomer band around a substrate support such that the elastomer band demonstrates increased resistance to degradation from exposure to a plasma environment.

SUMMARY

Disclosed herein is an elastomer band installation fixture that installs an elastomer band around a substrate support with increased resistance to degradation from exposure to a plasma environment and compression forces. An elastomer band installed around a substrate support with the installation fixture disclosed herein thus has a longer operational lifetime, thereby decreasing the frequency in which the elastomer band needs to be replaced. Also disclosed herein are methods of using the elastomer band installation fixture to install an elastomer band around a substrate support.

DETAILED DESCRIPTION

Substrate supports for reactive ion etch processing chambers typically include a lower electrode assembly comprising an electrostatic clamping layer on which a substrate or wafer is clamped during processing in a plasma processing chamber. The lower electrode assembly can also include various layers bonded to a temperature controlled base plate. For example, the assembly can include an upper ceramic layer incorporating one or more electrostatic electrodes adhesively bonded to an upper side of a heater plate, one or more heaters adhesively bonded to a bottom of the heater plate, and a temperature controlled base plate (hereafter referred to as cooling plate) adhesively bonded to the heaters and heater plate. To protect the plasma-exposed adhesive bond layers, an edge seal comprising an elastomer band may be disposed around the bond layers of the substrate support.

Figure 1:
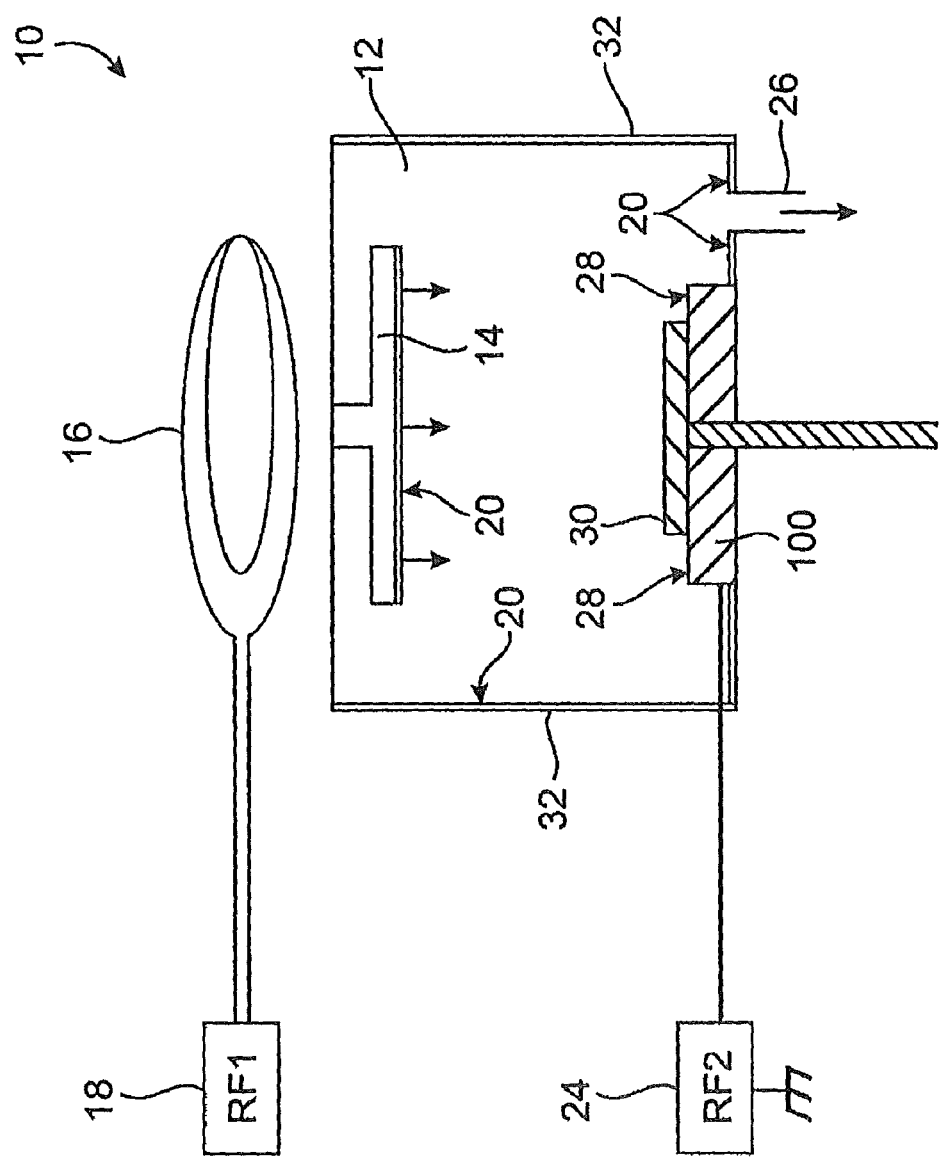
FIG. 1 shows a cross-sectional view of a processing chamber suitable for plasma etching semiconductor substrates.

FIG. 1 shows a cross-sectional view of an exemplary plasma reactor 10 for etching substrates. As shown in FIG. 1, the plasma reactor 10 includes a plasma processing chamber 12, an antenna disposed above the chamber 12 to generate plasma, which is implemented by a planar coil 16. The RF coil 16 is typically energized by an RF generator 18 via a matching network (not shown). Such chambers are called inductively coupled plasma (ICP) chambers. To supply process gas to the interior of the chamber 12, there is provided a gas distribution plate or showerhead 14, which preferably includes a plurality of holes for releasing gaseous source materials, e.g., the etchant source gases, into the RF-induced plasma region between the showerhead 14 and a semiconductor substrate or wafer 30 supported on a substrate support 100 comprising lower electrode assembly 28. While an inductively coupled plasma reactor is shown in FIG. 1, the plasma reactor 10 can incorporate other plasma generating sources such as capacitive coupled plasma (CCP), microwave, magnetron, helicon, or other suitable plasma generating equipment, in which case the antenna is omitted.

The gaseous source materials may also be introduced into the chamber 12 by other arrangements such as one or more gas injectors extending through the top wall and/or gas ejection ports built into the walls of chamber 12. Etchant source chemicals include, for example, halogens such as $Cl_2$ and $BCl_3$ when etching through aluminum or one of its alloys. Other etchant chemicals (e.g., $CH_4$, HBr, HCl, $CHCl_3$) as well as polymer forming species such as hydrocarbons, fluorocarbons, and hydro-fluorocarbons for side-wall passivation of etched features may also be used. These gases may be employed along with optional inert and/or nonreactive gases.

In use, a wafer 30 is introduced into chamber 12 defined by chamber walls 32 and disposed on the lower electrode assembly 28. The wafer 30 is preferably biased by a radio frequency generator 24 (also typically via a matching network). The wafer 30 can comprise a plurality of integrated circuits (ICs) fabricated thereon. The ICs, for example, can include logic devices such as PLAs, FPGAs and ASICs or memory devices such as random access memories (RAMs), dynamic RAMs (DRAMs), synchronous DRAMs (SDRAMs), or read only memories (ROMs). When the RF power is applied, reactive species (formed from the source gas) etch exposed surfaces of the wafer 30. The by-products, which may be volatile, are then exhausted through an exit port 26. After processing is complete, the wafer 30 can be subjected to further processing and eventually diced to separate the ICs into individual chips.

The plasma exposed surfaces of any plasma confinement apparatus (not shown), chamber wall 32, chamber liner (not shown) and/or showerhead 14 can be provided with a plasma sprayed coating 20 with surface roughness characteristics that promote polymer adhesion. In addition, plasma exposed surfaces of the substrate support 100 can also be provided with a plasma sprayed coating (not shown). In this manner, substantially all surfaces that confine the plasma will have surface roughness characteristics that promote polymer adhesion. In this manner, particulate contamination inside the reactor can be substantially reduced.

It can be appreciated that the reactor 10 can also be used for metal, dielectric and other etch processes. In plasma etch processing, the gas distribution plate can be a circular plate situated directly below a dielectric window in an ICP reactor or form part of an upper electrode assembly in a CCP reactor called a parallel plate reactor wherein the gas distribution plate is a showerhead electrode oriented parallel to a semiconductor substrate or wafer 30. The gas distribution plate/showerhead electrode contains an array of holes of a specified diameter and spatial distribution to optimize etch uniformity of the layers to be etched, e.g., a photoresist layer, a silicon dioxide layer and an underlayer material on the wafer.

An exemplary parallel-plate plasma reactor that can be used is a dual-frequency plasma etch reactor (see, e.g., commonly-owned U.S. Pat. No. 6,090,304, which is hereby incorporated by reference in its entirety). In such reactors, etching gas can be supplied to a showerhead electrode from a gas supply and plasma can be generated in the reactor by supplying RF energy at different frequencies from two RF sources to the showerhead electrode and/or a bottom electrode. Alternatively, the showerhead electrode can be electrically grounded and RF energy at two different frequencies can be supplied to the bottom electrode.

Figure 2:
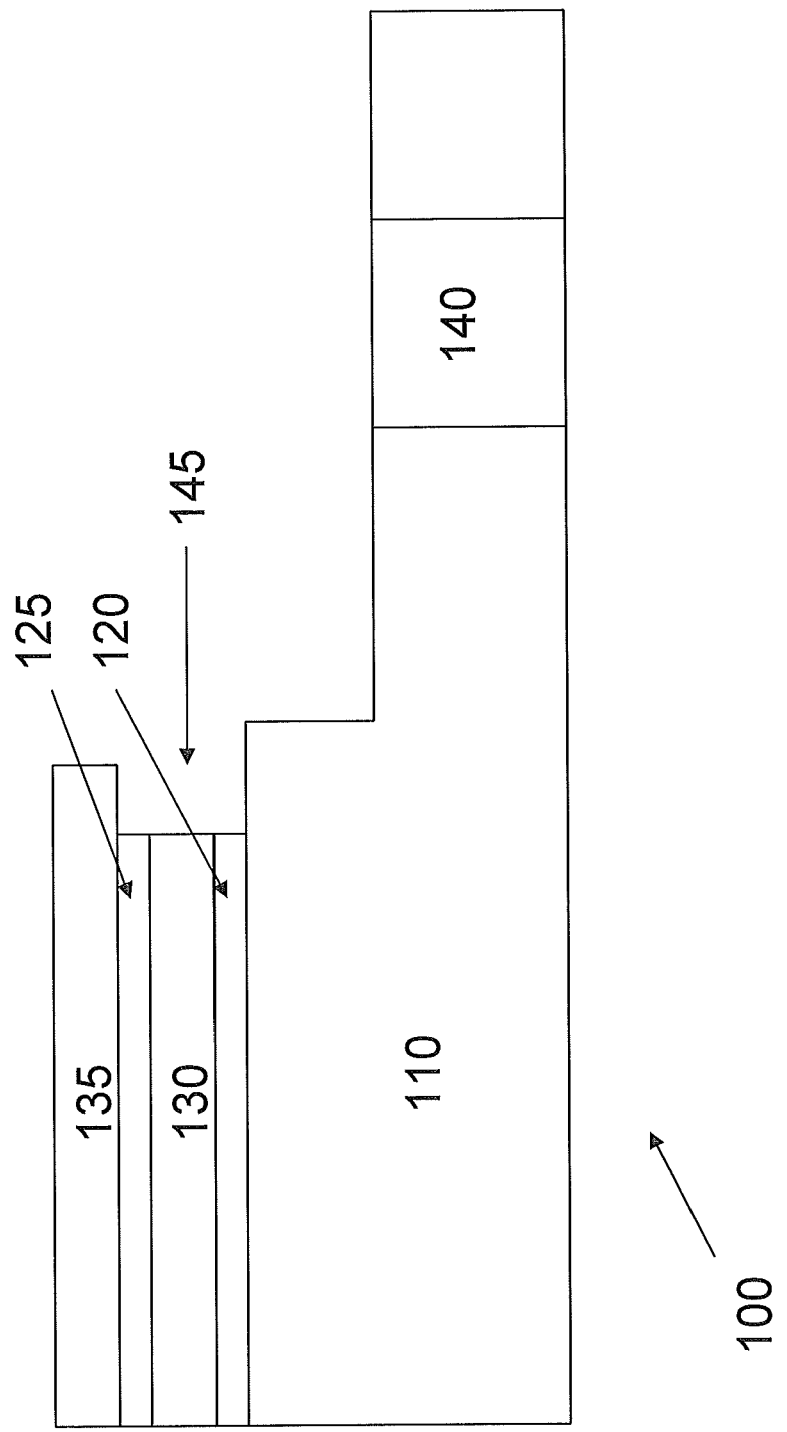
FIG. 2 shows a cross-sectional view of a substrate support having mounting groove therein.

FIG. 2 shows a cross-sectional view of a portion of substrate support 100 having various layers bonded together with exposed bond layers located in a mounting groove adapted to receive an edge seal comprising an elastomeric band. The substrate support 100 may also be adapted to receive a plurality of mechanical fasteners. Substrate support 100 comprises a heater plate 130 comprised of a metal or ceramic. Adhesive bonding layer 120 is disposed below the heater plate 130 and bonds heater plate 130 to cooling plate 110. Another adhesive bonding layer 125 is disposed above the heater plate 130 and bonds heater plate 130 to ceramic plate 135 incorporating one or more electrostatic clamping electrodes. Ceramic plate 135 and cooling plate 110 may have portions that extend beyond the outermost portions of heater plate 130 and bonding layers 120, 125 to form mounting groove 145. The outermost portions of the heater plate 140 and bond layers 120, 125 are substantially aligned with respect to one another. Preferably, ceramic plate 135 has a larger diameter that heater plate 130 and bonding layers 120, 125.

In one embodiment, cooling plate 110 can be configured to provide temperature control by the inclusion of fluid channels (not shown) therein through which a temperature controlled liquid can be circulated. The cooling plate 110 is typically a metal base plate which functions as the lower RF electrode in the plasma chamber. The cooling plate 110 preferably comprises an anodized aluminum or aluminum alloy. However, it can be appreciated that any suitable material, including metallic, ceramic, electrically conductive and dielectric materials can be used. In one embodiment, the cooling plate 110 is formed from an anodized machined aluminum block. Alternatively, the cooling plate 110 could be of ceramic material with one or more electrodes located therein and/or on an upper surface thereof. In addition, the cooling plate 110 preferably has a uniform thickness from the center to the outer edge or diameter thereof and is preferably a thin circular plate. The cooling plate 110 may comprise a series of though-holes 140 for receiving mechanical fasteners which fasten substrate support 100 to the processing chamber.

The heater plate 130 may be in the form of a metal or ceramic plate with at least one film heater coupled to a bottom of the metal or ceramic plate. The film heater can be a foil laminate (not shown) comprising a first insulation layer (e.g., dielectric layer), a resistive heating layer (e.g., one or more strips of electrically resistive material) and a second insulation layer (e.g., dielectric layer). The insulation layers preferably consist of materials having the ability to maintain its physical, electrical and mechanical properties over a wide temperature range including resistance to corrosive gases in a plasma environment such as Kapton or other suitable polyimide films. The resistive heating layer preferably consists of a high strength alloy such as Inconel or other suitable alloy or anti-corrosion and resistive heating materials. Typically, the film heater is in the form of a laminate of Kapton, Inconel and Kapton having a total thickness of about 0.005 to about 0.009 of an inch and more preferably about 0.007 of an inch thick.

Ceramic layer 135 preferably is an electrostatic clamping layer of ceramic material with an embedded electrode comprised of a metallic material, such as W, Mo etc. In addition, the ceramic layer 135 preferably has a uniform thickness from the center to the outer edge or diameter thereof and is preferably a thin circular plate suitable for supporting 200 mm, 300 mm or 450 mm diameter wafers. Details of a lower electrode assembly having an upper electrostatic clamping layer, heater layer and bonding layers are disclosed in commonly owned U.S. Published Patent Application 2006/0144516 wherein the upper electrostatic clamping layer has a thickness of about 0.04 inch, the upper bonding layer has a thickness of about 0.004 inch, the heater plate comprises a metal or ceramic plate of about 0.04 inch thickness and a heater film of about 0.01 inch thickness, and the lower bonding layer has a thickness of about 0.013 to 0.04 inch. However, different thicknesses of the clamping layer, bond layers and heater layer can be selected to achieve desired process results.

Adhesive bonding layers 120 and 125 are preferably formed from a low modulus material such as an elastomeric silicone or silicone rubber material. However, any suitable bonding material can be used. It can be appreciated that the thickness of adhesive layers 120 and 125 can vary depending on the desired heat transfer coefficient. Thus, the thickness thereof can be uniform or non-uniform to provide a desired heat transfer coefficient based on manufacturing tolerances of adhesive bonding layers 120 and 125. Typically, the thickness of adhesive bonding layers 120 and 125 will vary over its applied area by plus or minus a specified variable. Preferably, if the bond layer thickness does not vary by more than 1.5 percent, the heat transfer coefficient between components of the substrate support 100 can be made substantially uniform. For example, for a substrate support comprising an electrode assembly used in the semiconductor industry, adhesive bonding layers 120 and 125 preferably have a chemical structure that can withstand a wide range of temperatures. Thus, it can be appreciated that the low modulus material can comprise any suitable material, or combination of materials, such as a polymeric material compatible with a vacuum environment and resistant to thermal degradation at high temperatures (e.g., up to 500° C.). In one embodiment, adhesive bonding layers 120 and 125 may comprise silicone and be between about 0.001 to about 0.050 of an inch thick and more preferably about 0.003 to about 0.030 of an inch thick.

As shown in FIG. 2, a portion of the cooling plate 110 and ceramic plate 135 can extend beyond an outermost portion of the heater plate 130, adhesive bond layers 120 and 125, thereby forming a mounting groove 145 in the substrate support 100. The material(s) of adhesive bonding layers 120 and 125 are typically not resistant to the reactive etching chemistry of semi-conductor plasma processing reactors and must, therefore, be protected to accomplish a useful operation lifetime. To protect the adhesive bonding layers 120 and 125, it has been proposed to place an edge seal in the form of an elastomeric band, into the mounting groove 145 to form a tight seal that prevents penetration of the corrosive gases of semi-conductor plasma processing reactors. See, for example, commonly owned U.S. Published Applications 2009/0290145 and 2010/0078899.

Typically, such an elastomer band is installed by hand in a 5-point star-shaped stretching pattern. In other words, a portion of the elastomer band is inserted into a mounting groove and another portion of the elastomer band, generally the portion that is about 144° away from the first portion inserted in the mounting groove, is stretched and inserted into the mounting groove. This stretching process is repeated with subsequent portions of the elastomer band that are about 144° away from the previously inserted portion until the elastomer band is completely inserted into the mounting groove. However, such a method of inserting the elastomer band leads to highly localized stressed areas in the elastomer band. These stressed areas are weaker than other areas in the elastomer band and are subject to greater mass loss when exposed to a plasma environment. The greater mass loss, in turn, leads to degradation, such as cracking, of the elastomer band, thereby necessitating replacement of the elastomer band.

Figure 3:
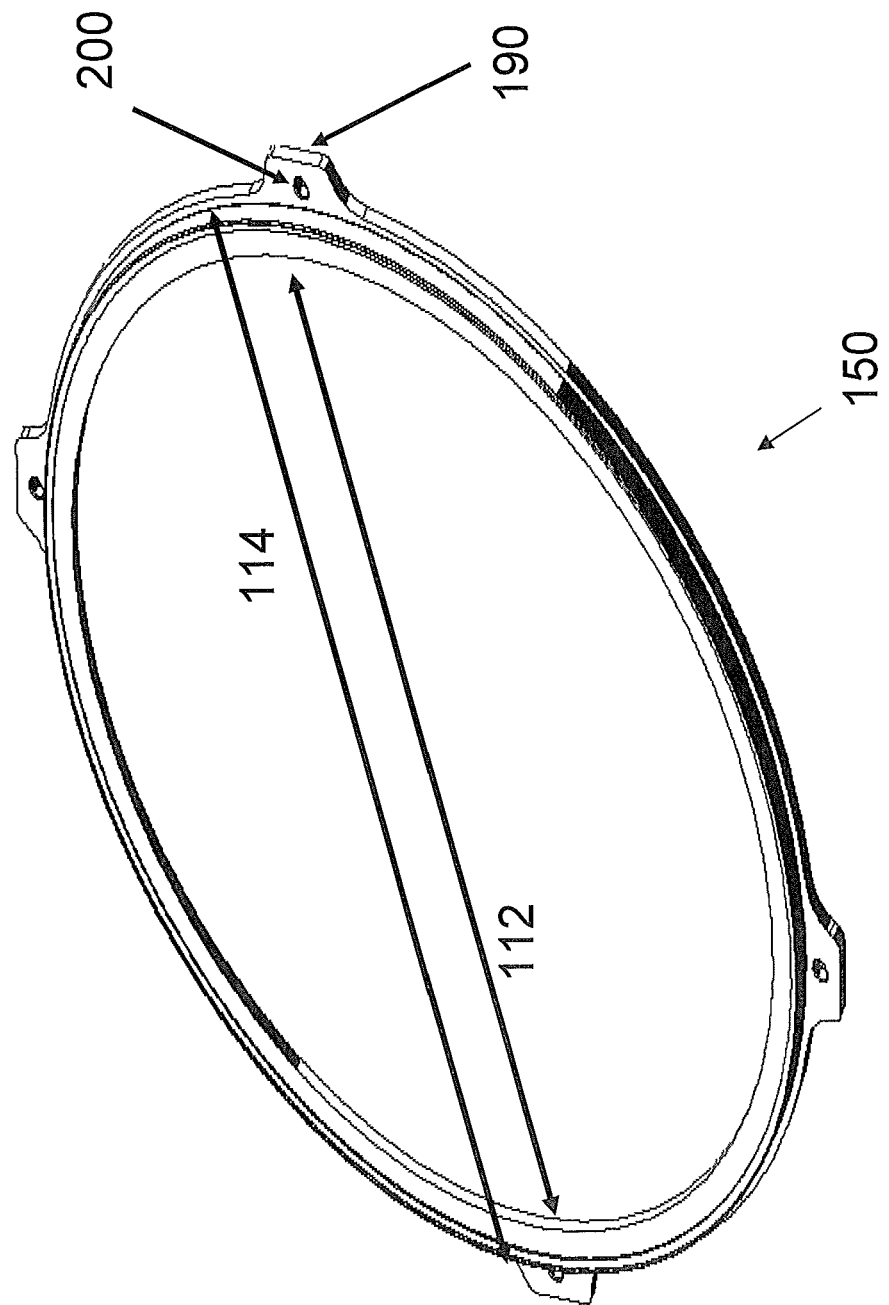
FIG. 3 shows a perspective view of an elastomer band installation fixture.

FIG. 3 shows an installation fixture 150 that can be used to relieve such stressed areas of an elastomer band. Installation fixture 150 may be annular and adapted to mount an elastomer band in a mounting groove around a semiconductor substrate support. Using installation fixture 150 to install an elastomer band around a substrate support will reduce local stresses in the elastomer band and reduce the chances of the elastomer band cracking under operational conditions, e.g., when exposed to a plasma environment. This leads to an elastomer band with a longer operational lifetime when compared to those installed by hand in a 5-point star-shaped stretching pattern. Installation fixture 150 comprises a plurality of radially extending portions 190 each comprising a through-hole 200. These radially extending portions 190 are adapted to receive a plurality of mechanical fasteners at locations corresponding to mounting holes in the semiconductor substrate support. Preferably, installation fixture 150 comprises four radially extending portions 190. The spacing of each radially extending portion 190 around installation fixture 150 is not particularly limited and preferably, each radially extending portion 190 is disposed about 72° and 108° from neighboring radially extending portions 190. Alternatively, each radially extending portion 190 may be disposed about 90° from neighboring radially extending portions 190. The inner diameter 112 and outer diameter 114 of installation fixture 150 is not particularly limited, so long as installation fixture 150 is sized accordingly with respect to the size of the substrate support.

Figure 4:
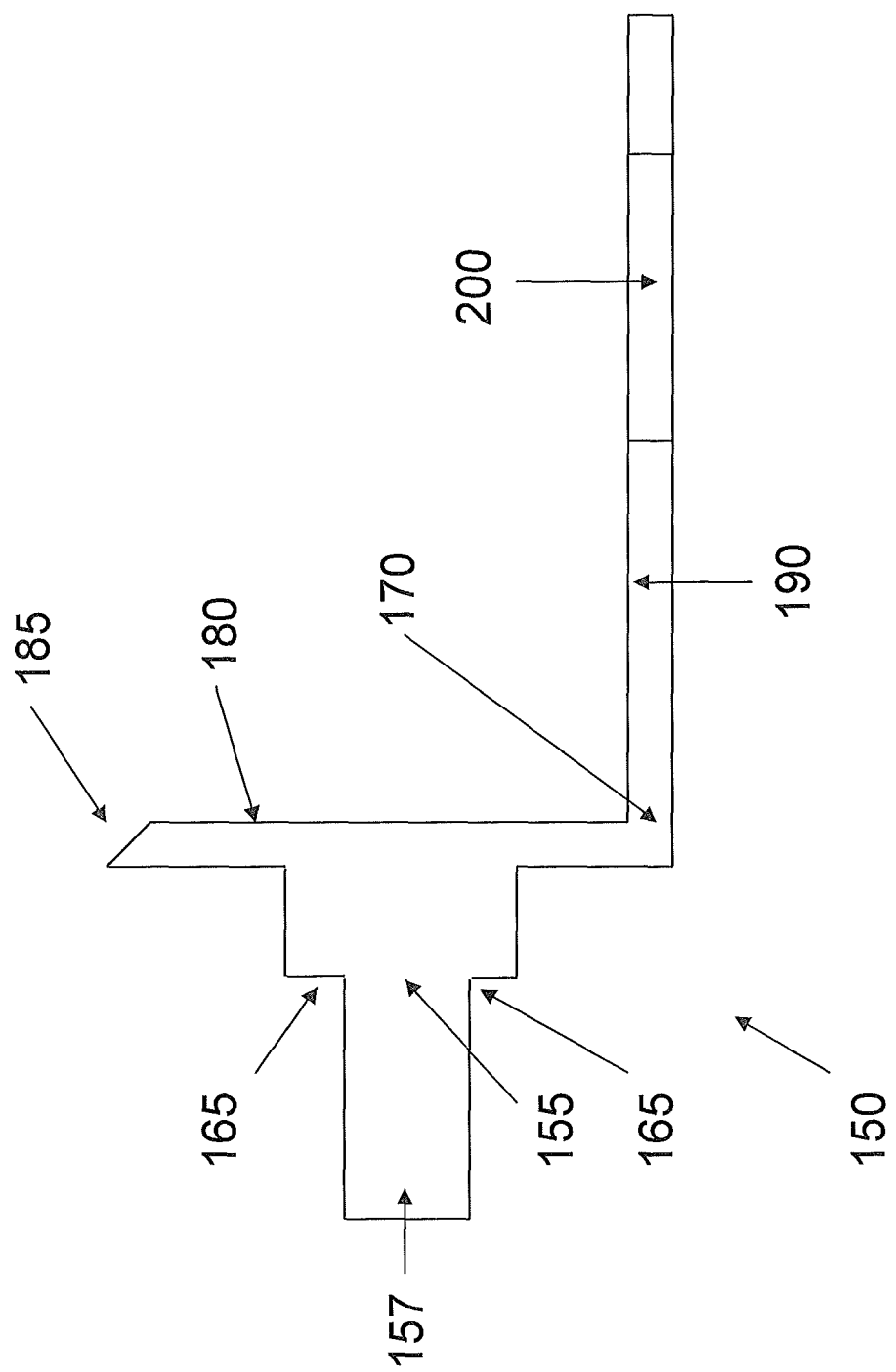
FIG. 4 shows a cross-sectional view of an elastomer band installation fixture.

FIG. 4 shows a cross-sectional view of installation fixture 150, which comprises an inner portion 155 and an outer portion 170. Inner portion 155 is adapted to be located above an outer portion or periphery of an upper surface of substrate support 100. For example, inner portion 155 is adapted to be received on and contact ceramic layer 135 at an outer portion or periphery thereof. Inner portion 155 may comprise recesses 165 on both horizontal surfaces such that these recesses 165 help with alignment of installation fixture 150 with respect to substrate support 100. Un-recessed portions of inner portion 155 may contact an outer periphery of ceramic layer 135. Recesses 165 also allow for minimization of contact between the horizontal surfaces of inner portion 155 of installation fixture 150 and the ceramic layer 135 in order to prevent contamination of the ceramic layer 135, which, in turn, prevents contamination of a substrate or wafer surface to be processed. The depth of recesses 165 is not particularly limited, so long as a sufficient spacing is provided between a horizontal surface of inner portion 155 disposed closest to the outermost surface of ceramic layer 135. The recesses 165 may have a depth between about 0.01-0.05 inch. Preferably, recesses 165 have a depth of about 0.025 inch. Portion 157 of inner portion 155 is a horizontal protrusion that increases the rigidity of installation fixture 150 such that the fixture 150 does not bend during installation of elastomer band 250 around substrate support 100. If the installation fixture 150 is bent sufficiently during installation, the elastomer band 250 may fall off the fixture 150 or the fixture 150 may be permanently distorted, necessitating it's replacement. Outer portion 170 comprises a vertically extending portion 180 and a radially extending portion 190 comprising a through-hole 200. Vertically extending portion 180 may comprise an angled tip 185 at a free end thereof. Preferably, the angle of the angled tip 185 is between about 10°-45° and most preferably, about 20°. The through-holes 200 of the radially extending portion 190 of outer portion 180 are adapted to align with though-holes 140 of cooling plate 110. Preferably, installation fixture 150 has an inner diameter 112 with respect to an innermost surface of inner portion 155 of between about 10.5 to 11.5 inches with respect a substrate support designed for processing substrates or wafers with a 300 mm diameter. Preferably, inner diameter 112 is about 11.0 inches. Preferably, installation fixture has an outer diameter 114 with respect to an outermost surface of vertically extending portion 180 of between about 11.0 to 12.0 inches with respect a substrate support designed for processing substrates or wafers with a 300 mm diameter. Preferably, outer diameter 114 is about 11.7 inches. With respect to processing substrates or wafers with a diameter less than 300 mm, such as 200 mm, or greater than 300 mm, such as 450 mm, the diameters of installation fixture 150 are scaled accordingly. Outer diameter 114 may also be determined by the diameter of elastomer band 250 and the band's stretching tolerance.

Preferably, installation fixture 150 is made from a low-friction plastic material such as polyethylene terephthalate (PET) or a fluorocarbon, e.g., TEFLON (PTFE—PolyTetraFluoroEthylene, manufactured by DuPont). Alternatively, installation fixture 150 may be made from other materials, such as quartz, ceramic, metal or silicon. Methods of making installation fixture 150 are not particularly limited. For example, installation fixture 150 may be machined from a block or annular piece of starting material. Alternatively, installation fixture 150 may be injection molded.

Figure 5:
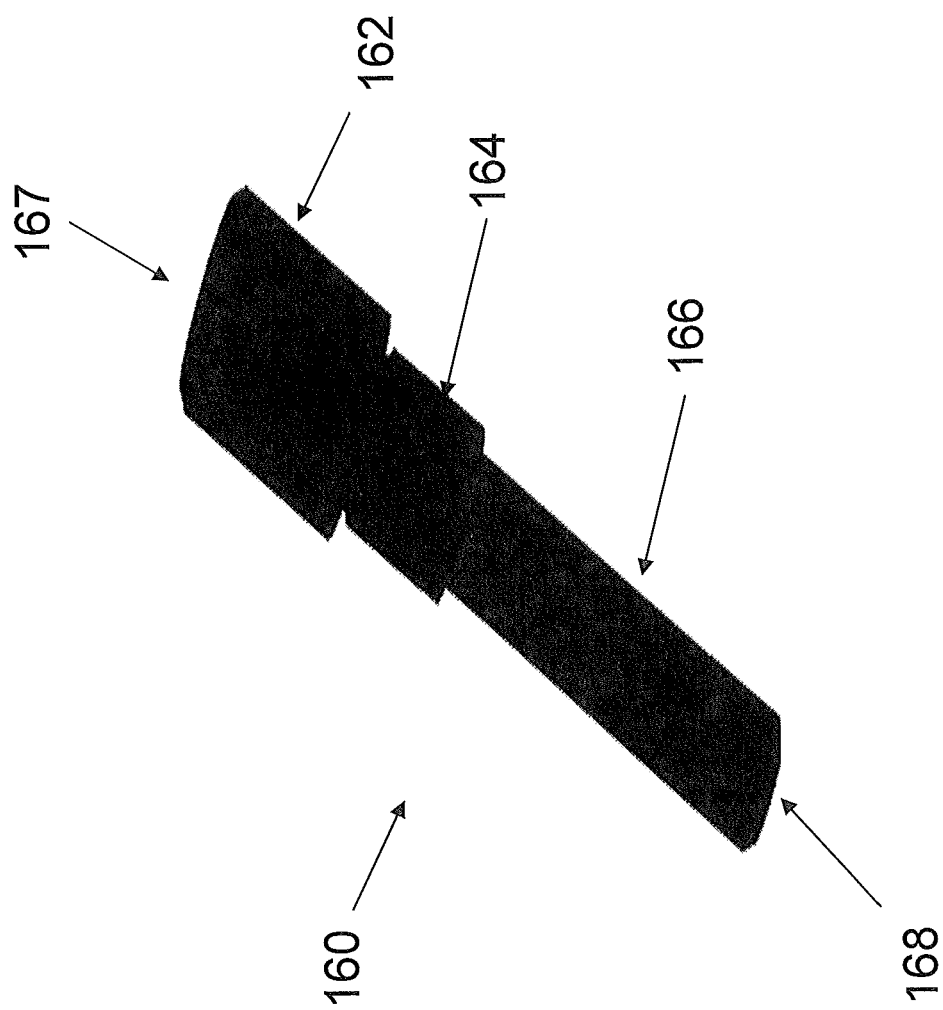
FIG. 5 shows a perspective view of a mechanical fastener for securing an elastomer band installation fixture to a substrate support.

FIG. 5 shows a representative mechanical fastener 160 used for rotationally constraining installation fixture 150 with respect to substrate support 100. Mechanical fastener 160 may be a locking pin adapted to fit through both through-holes 140 of substrate support 100 and through-holes 200 of installation fixture 150. Preferably, mechanical fastener 160 is cylindrical or hemi-cylindrical in shape. Mechanical fastener 160 may comprise a plurality of portions along its length that have varying diameters. For example, and without limitation, one end portion 162 of mechanical fastener 160 may comprise the largest diameter, one end portion 166 of mechanical fastener 160 may comprise the smallest diameter and a central portion 164 may comprise an intermediate diameter. However, mechanical fastener 160 may be shaped other than cylindrical, such as square, tapered or polygonal. Preferably, end surfaces 167 and 168 of mechanical fastener 160 are recessed and adapted to receive the head of each bolt that fastens the substrate support 100 to a work-piece, such as a table or chamber wall. For example, if the bolts that fasten substrate support 100 to the work-piece are dome-shaped, then end surfaces 167 and 168 of mechanical fastener 160 may be recessed with a similar dome-shape or similar concavity. If the bolts that fasten substrate support 100 to the work-piece are hexagonally-shaped, then end surfaces 167 and 168 of mechanical fastener 160 may be recessed with a similar hexagonal shape. Alternatively, installation fixture 150 may be rotationally constrained with respect to substrate support 100 by locking pins that press up against a work-piece and the installation fixture 150 rather than fit through aligned through-holes 200 and 140. When through-holes 200 and 140 are aligned, mechanical fastener 160 can be inserted through each set of aligned through-holes 200 and 140 such that installation fixture 150 is rotationally constrained with respect to substrate support 100. The dimensions of mechanical fastener 160 are not particularly limited, so long as it can sufficiently rotationally constrain installation fixture 150 when installed. The length of mechanical fastener 160, from surface 167 to surface 168, is preferably between about 1-2 inches. More preferably, the length is about 1.4 inches. End portion 162 preferably has a length of about 0.3-0.5 inch and, more preferably, about 0.375 inch. End portion 166 preferably has a length of about 0.5-0.8 inch and, more preferably, about 0.7 inch. Central portion 164 preferably has a length of about 0.2-0.4 inch and, more preferably, about 0.3 inch. The diameter of each of these portions are also not particularly limited, so long as end portions 162 and 166 are able to fit within through-hole 140 of cooling plate 110 and so long as central portion 164 is able to fit within through-hole 200 of the radially extending portion 190 of installation fixture 150.

Figure 6:
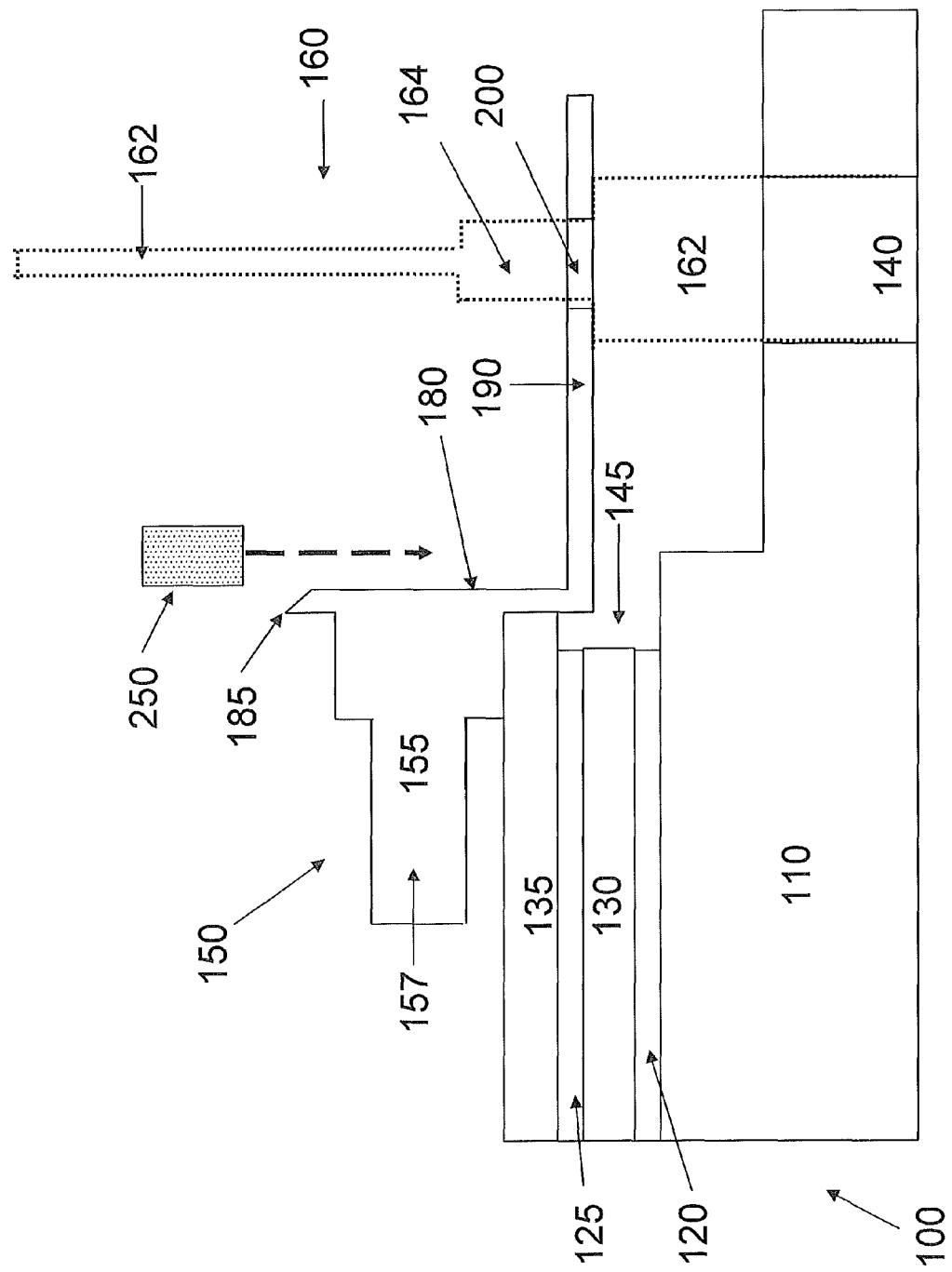
FIG. 6 shows a cross-sectional view of an installation fixture secured to a substrate support using mechanical fasteners.

FIG. 6 shows a cross-sectional view of an embodiment of a beginning step of a method of installation of an elastomer band as disclosed herein. End portion 162 with the largest diameter of each mechanical fastener 160 is secured into each through-hole 140 of cooling plate 110. Next, installation fixture 150 is located over ceramic layer 135 of the substrate support 100 such that each radially extending portion 190 with through-holes 200 is aligned with each mechanical fastener 160 placed into each through-hole 140 of cooling plate 110 and un-recessed portions of inner portion 155 contacts an outer periphery of ceramic layer 135. Installation fixture 150 is then disposed over ceramic layer 135 with angled tip 185 of vertically extending portion 180 facing away from ceramic layer 135, such that the through-holes 200 of installation fixture 150 are disposed around central portions 164 of mechanical fasteners 160. The installation fixture 150 is now rotationally constrained with respect to substrate support 100. An elastomer band 250 may now be placed around an outer circumference of vertically extending portion 180 of installation fixture 150, as indicated by the downward facing dashed arrow.

Figure 7:
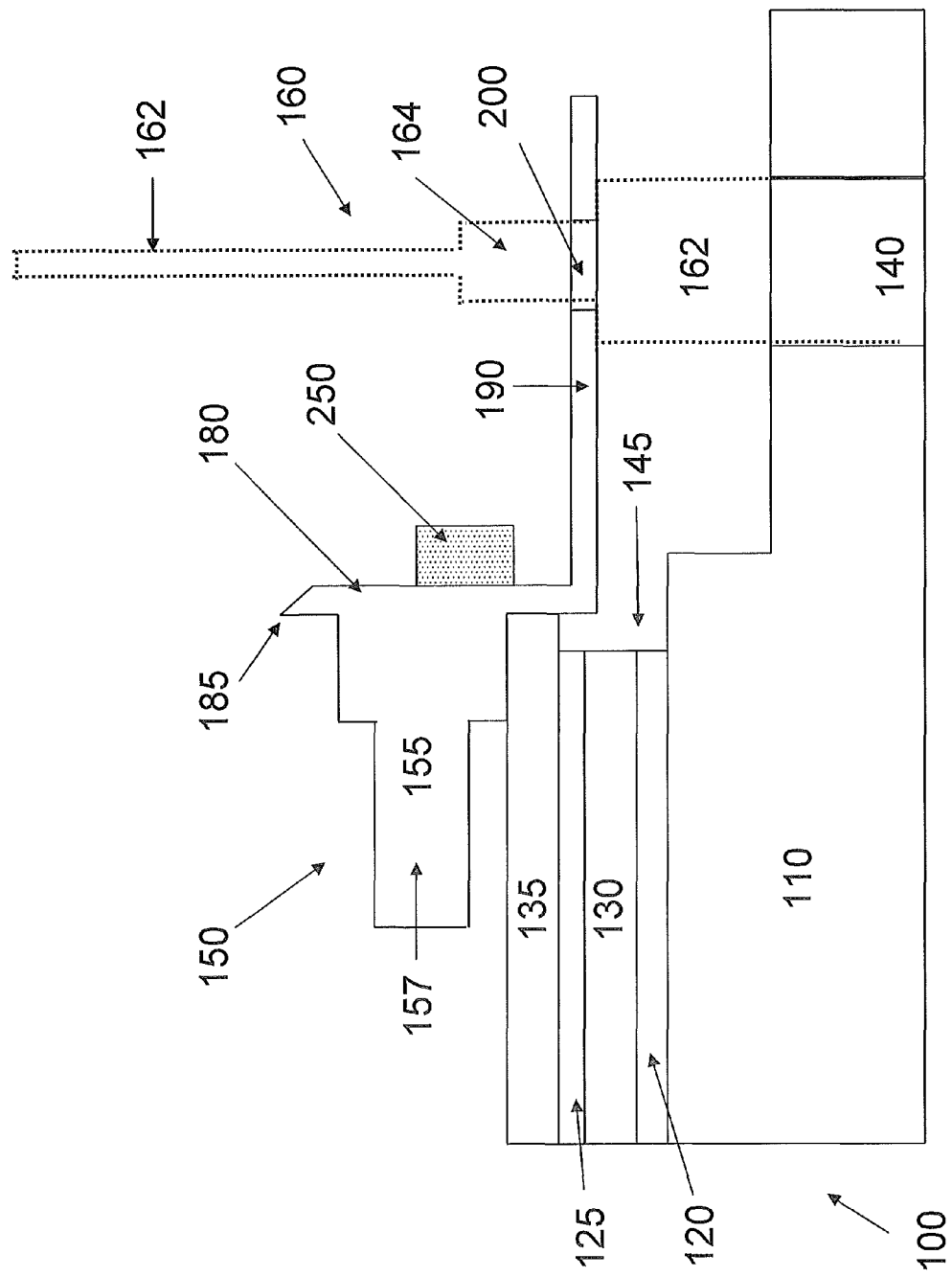
FIG. 7 shows a cross-sectional view of an installation fixture secured to a substrate support using mechanical fasteners with an elastomer band disposed around an outer circumference of the installation fixture.

FIG. 7 shows a cross-sectional view of an embodiment of an intermediate step of a method of installation of an elastomer band as disclosed herein. Elastomer band 250 is placed around an outermost circumference of vertically extending portion 180 by stretching the elastomer band 250 to fit the circumference. Preferably, elastomer band 250 is not stretched more than 2% of its circumference when placed around an outermost circumference of vertically extending portion 180, as doing so may permanently distort its elasticity. Angled tip 185 of vertically extending portion 180 aids in ensuring that elastomer band 250 is not stretched more than 2% of its circumference as well as facilitating the sliding of elastomer band 250 into a mounting groove, such as mounting groove 145. Elastomer band 250 may be relieved of its localized internal stresses by rotation back and forth around installation fixture 150. Elastomer band 250 may be rotated back and forth around installation fixture 150 by at least about 20°. Preferably, elastomer band 250 is rotated back and forth around installation fixture 150 by at least about 20°-90° and more preferably, by at least about 180°. Preferably, the rotation back and forth is carried out at least twice, and more preferably, at least 4-5 times.

Figure 8:
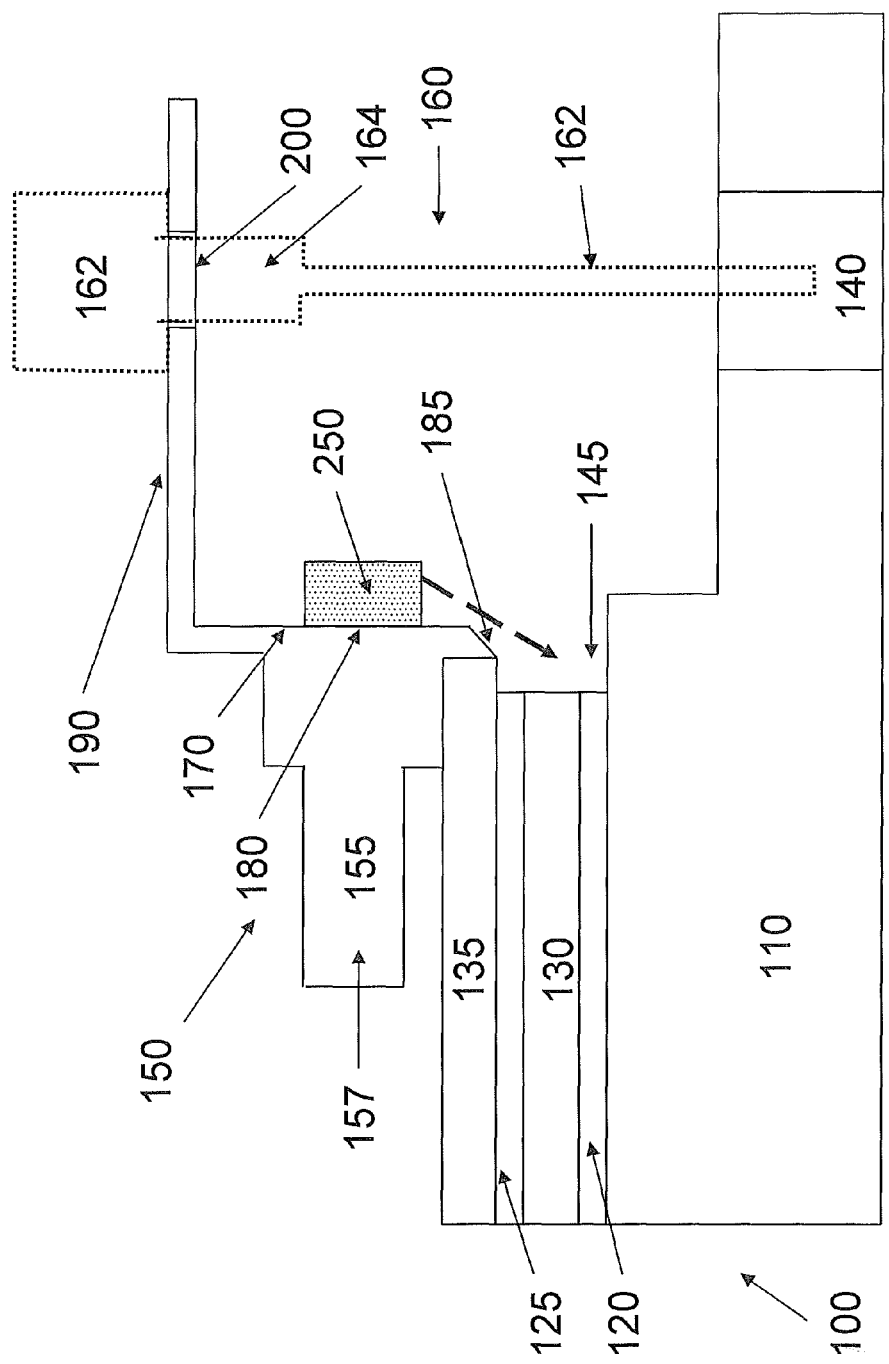
FIG. 8 shows a cross-sectional view of how an elastomer band is inserted into a mounting groove of a substrate support with the installation fixture.

FIG. 8 shows a cross-sectional view of an embodiment of a second intermediate step of a method of installation of an elastomer as disclosed herein. After elastomer band 250 has been rotated back and forth and its localized internal stresses relieved, installation fixture 150 and the mechanical fasteners 160 are inverted 180° about the horizontal plane of installation fixture 150 and re-secured to substrate support 100. In other words, installation fixture 150 and the mechanical fasteners 160 are flipped upside down such that angled tip 185 is downward facing and proximate mounting groove 145. Unrecessed portions of inner portion 155 contact an upper surface of an outer periphery of ceramic layer 135. Elastomer band 250 is then slid off of vertically extending portion 180 of installation fixture 150 and into mounting groove 145, as indicated by the downward facing dashed arrow. Installation fixture 150 and mechanical fasteners 160 may now be removed from substrate support 100.

Figure 9A:
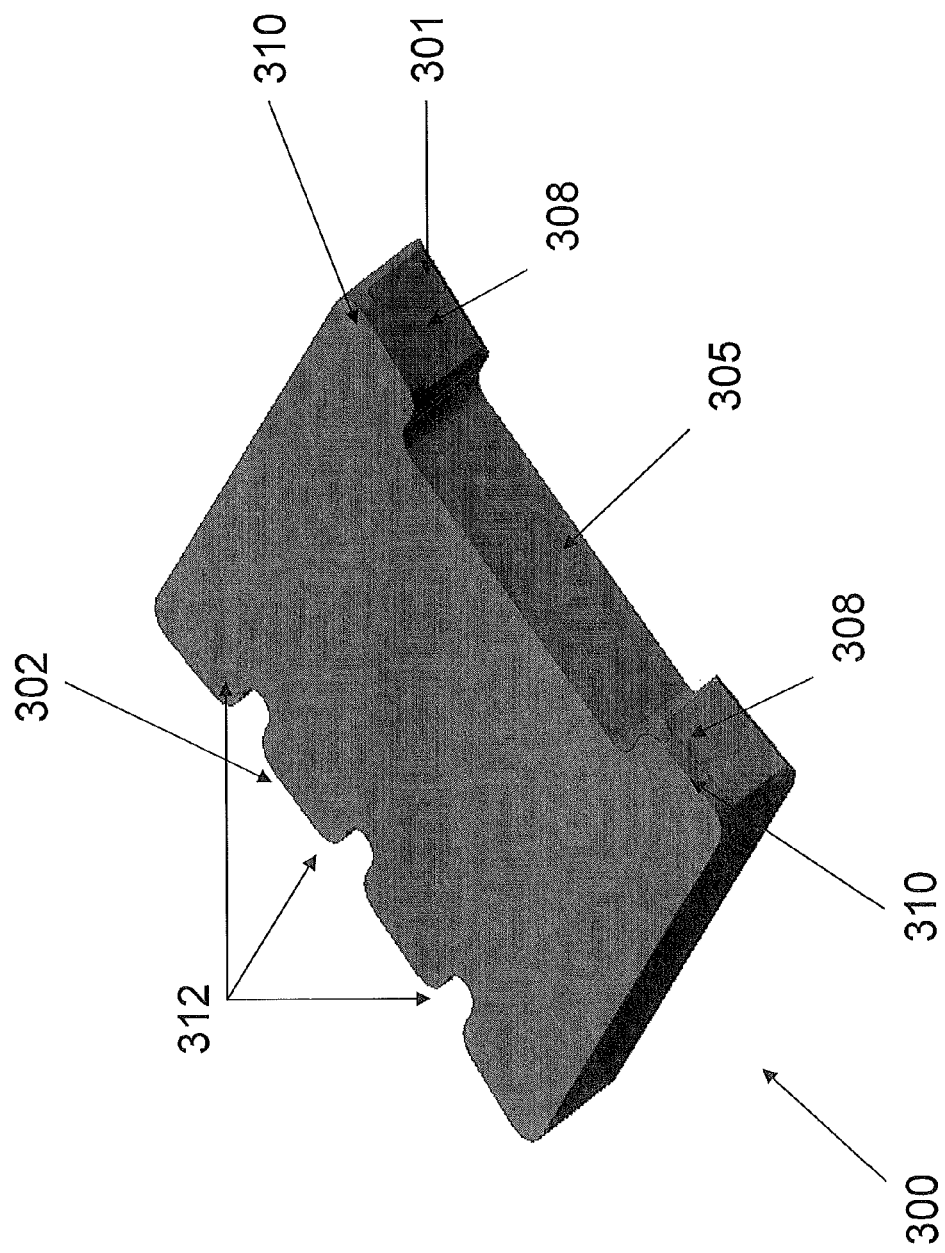
FIG. 9A shows a perspective view of an embedding tool used for completely inserting an elastomer band into a mounting groove.
Figure 9B:
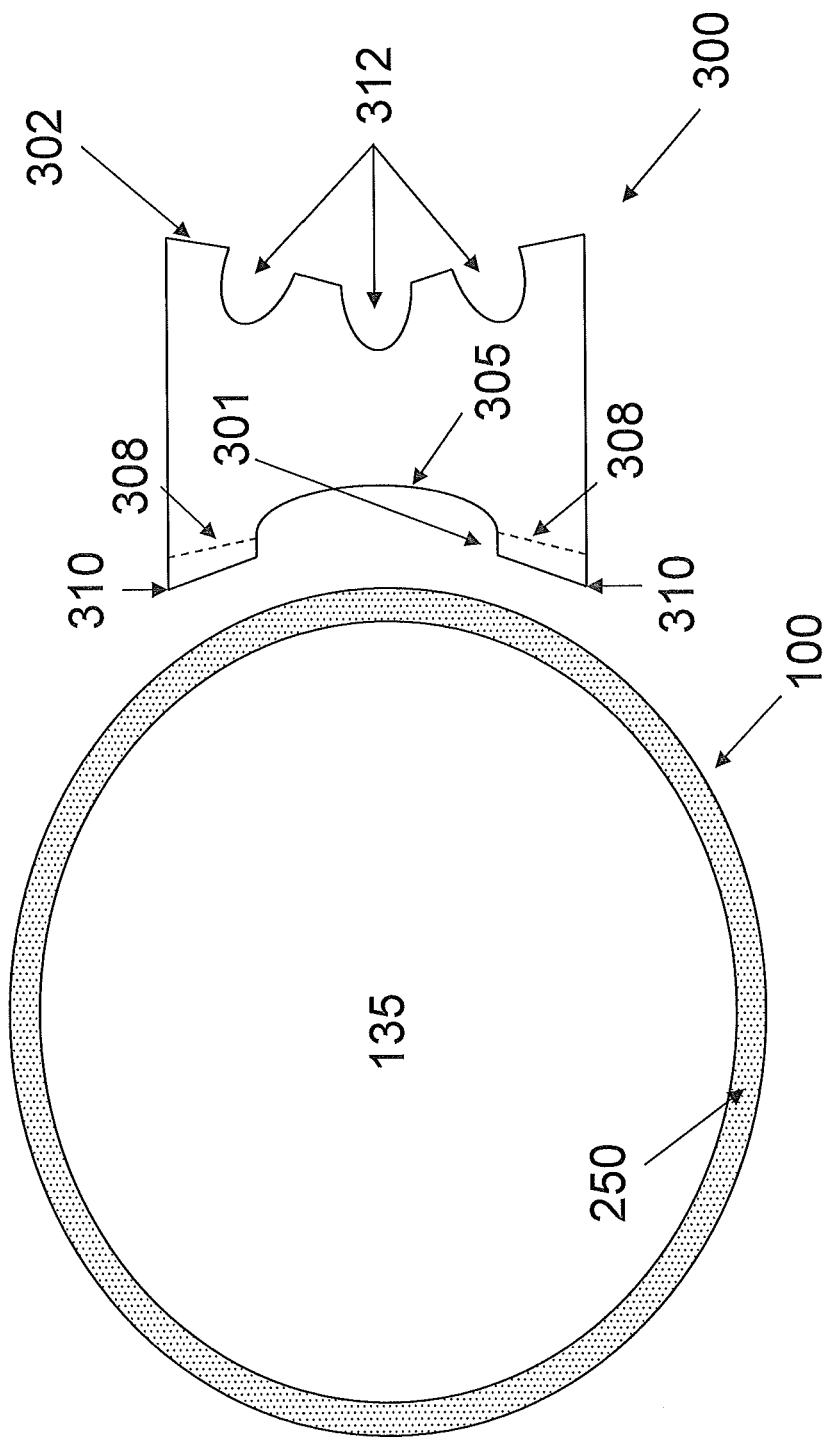
FIG. 9B shows a top view of an embedding tool and elastomer band inserted into a mounting groove of a substrate support.

When the elastomer band 250 has been placed into mounting groove 145, it may be required to press elastomer band 250 further into mounting groove 145. FIG. 9A shows a representative embedding tool 300 that can be used for pressing elastomer band 250 further into a mounting groove. Embedding tool 300 may be a curved piece that is less than 4 inches wide, preferably about 2 inches wide. Embedding tool 300 may also be less than 4 inches long, preferably about 2 inches long. Embedding tool 300 may also be less than one inch thick, preferably about 0.3-0.5 inch thick. Embedding tool 300 may be comprised of plastic, quartz, ceramic, metal, or silicon. Preferably, embedding tool 300 is comprised of a plastic such as polyetheretherketon (PEEK) or a fluorocarbon, e.g., TEFLON. Embedding tool 300 may be square or rectangular in shape. Preferably, two opposing side surfaces 301, 302 of tool 300 are curved in a concave manner to facilitate pressing of elastomer band 250. Preferably, the curved side surfaces 301, 302 have a radius of curvature that is substantially the same as the substrate support, as shown in FIG. 9B. Side surface 301 may comprise a recess 305 at an inner portion thereof, with radially extending portions 308 at the outer portions thereof. Each radially extending portion 308 preferably comprises a projection 310 adapted to press elastomer band 250 further into the mounting groove. Side surface 302 may comprises a series of indentations 312. Preferably, side surface 302 comprises three indentations 312 that are equilaterally spaced across side surface 302. Side surface 302 is adapted to be pressed across the elastomer band 250 to further compress elastomer band 250 into the mounting groove to ensure that elastomer band 250 does not substantially extend beyond the mounting groove it is inserted into.

Figure 10:
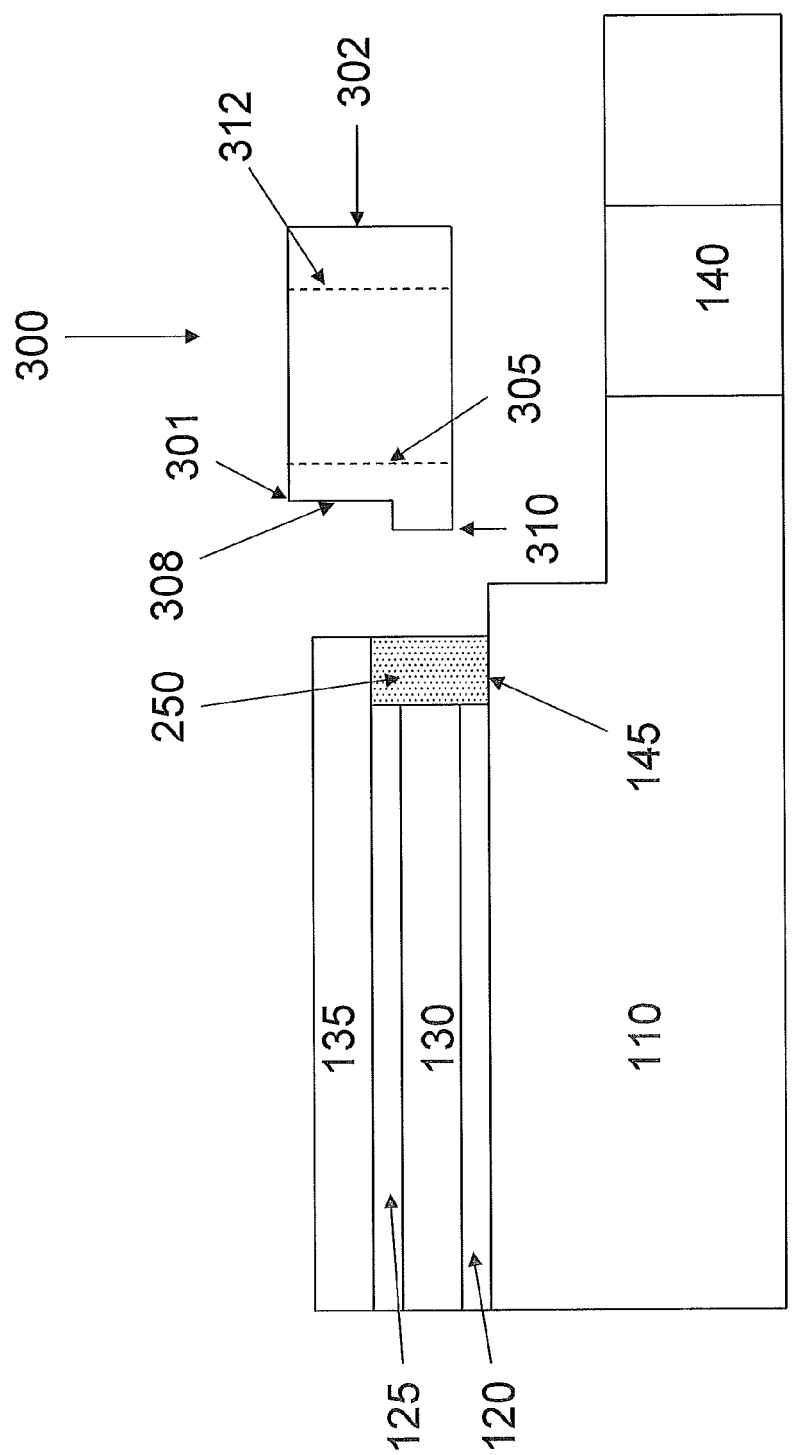
FIG. 10 shows a cross-sectional view of how the embedding tool can completely insert an elastomer band into a mounting groove.

FIG. 10 shows a cross-sectional view of an embodiment of a final step of a method of installation of an elastomer band as disclosed herein. After elastomer band 250 has been inserted into a mounting groove, projections 310 of radially extending portions 308 of side surface 301 of embedding tool 300 may be moved along the outward facing surface of elastomer band 250 to press against elastomer band 250 and further insert elastomer band 250 into the mounting groove. Afterwards, side surface 302 of embedding tool 300 may be moved along the outward facing surface of elastomer band 250 and an outer surface of cooling plate 110 to ensure that elastomer band 250 does not substantially extend beyond the mounting groove it is inserted into.

Thus, a method of installing an elastomer band 250 as a protective edge seal around a portion of a substrate support 100 used for supporting a semiconductor substrate in a plasma processing chamber may be summarized as follows: a) disposing an elastomer band 250 around a vertically extending portion 180 of installation fixture 150; and b) sliding the elastomer band 250 off the vertically extending portion 180 of the installation fixture 150 and into a mounting groove 145 in the substrate support 100 adapted to receive the elastomer band 250.

The method may further optionally comprise the following steps of, prior to step a) above, securing a substrate support 100 to a work-piece, such as a table or a processing chamber wall, disposed inside or outside of a processing chamber; securing the installation fixture 150 to the substrate support 100 with at least one mechanical fastener 160 such that the installation fixture 150 is rotationally constrained with respect to the substrate support 100 and such that vertically extending portion 180 of installation fixture 150 faces away from the substrate support 100. The method may further optionally comprise the following steps of, between steps a) and b) above, rotating the elastomer band 250 around the vertically extending portion 180 of the installation fixture 150; positioning the installation fixture 150 such that the vertically extending portion 180 of the installation fixture 150 faces the substrate support 100; and securing the installation fixture 150 to the substrate support 100 while the vertically extending portion 180 of the installation fixture 150 faces the substrate support 100. The method may further optionally comprise the following step of, after step b) above, pressing a tool 300 against the elastomer band 250 and compressing the elastomer band 250 into the mounting groove 145 such that the elastomer band 250 is completely inserted into mounting groove 145.

It is noted that the method described above installs elastomer band 250 around a substrate support 100 while the substrate support is disposed either inside or outside a processing chamber. Due to ease of installation, it is preferable to install elastomer band 250 around substrate support 100 while substrate support 100 is disposed outside of a processing chamber. For example, when outside of a processing chamber, substrate support 100 may be mechanically fastened to a work-piece, such as a table, for installation of elastomer band 250. When inside of a processing chamber, substrate support 100 may also be mechanically fastened to a work-piece, such as a chamber wall, for installation of elastomer band 250.

The method described above may be carried out with an elastomer installation kit comprising: a) a plurality of mechanical fasteners each comprising at least three portions with different diameters; b) an annular installation fixture comprising an inner portion adapted to be located above an outermost top surface of a substrate support and an outer portion surrounding the inner portion, the outer portion comprising a vertically extending portion adapted to receive an elastomer band and a plurality of radially extending portions adapted to receive a plurality of mechanical fasteners; and c) a curved embedding tool adapted to press an elastomer band into a mounting groove in a substrate support, the tool comprising two opposing surfaces that are curved in a concave manner, wherein one curved surface comprises a recess at an inner portion thereof with radially extending portions at outer portions thereof, each radially extending portion comprising a projection; and wherein the opposing curved surface comprises a series of equilaterally spaced indentations.

The use of installation fixture 150, mechanical fasteners 160 and embedding tool 300 to install an elastomer band around a substrate support can provide advantages over elastomer bands installed by the more traditional "5-point star-shaped pattern." For example, elastomer bands installed as disclosed herein can provide increased serviceability of a substrate support disposed in chambers such as plasma etch chambers. This increased serviceability results from increased resistance to corrosive plasma environments, which leads to a reduced tendency of the elastomer band to crack under operational conditions, e.g., plasma etching. Elastomer bands installed as disclosed herein have an operational lifetime that is about twice that of elastomer bands installed by the more traditional "5-point star-shaped pattern."

The elastomer band 250 can be constructed from any suitable semiconductor processing compatible material. For example, elastomer band 250 is preferably constructed of curable fluoroelastomeric fluoropolymers (FKM) capable of being cured to form a fluoroelastomer or curable perfluoroelastomeric perfluoropolymers (FFKM) can be used. The elastomer band 250 is preferably comprised of a material having high chemical resistance, low and high temperature capability, resistance to plasma erosion in a plasma reactor, low friction, and electrical and thermal insulation properties. A preferred material is a perfluoroelastomer having a Shore A durometer hardness including, but not limited to, 60 to 85 and a specific gravity including, but not limited to 1.9 to 2.1 such as PERLAST available from Perlast Ltd. Another band material is KALREZ available form DuPont Performance Elastomers. PERLAST and KALREZ are FFKM elastomers. The shape of the elastomer band 250 is also not particularly limited and the elastomer bands may be circular, square or rectangular in cross-section. The elastomer bands 250 may also have an irregularly shaped cross-section, such as rectangular cross-section with a concave outer surface as disclosed in commonly owned U.S. application Ser. No. 13/277,873, filed Oct. 20, 2011.

It can be appreciated that a substrate support comprising an elastomer band installed as disclosed herein using installation fixture 150, mechanical fasteners 160 and embedding tool 300 to install an elastomer band around a substrate support can be adapted in any new processing chamber suitable for plasma processing semiconductor substrates or adapted to retrofit existing processing chambers. It should be appreciated that in a specific system, the specific shape of the ceramic plate 135, the cooling plate 110 and the heater plate 130 may vary depending on the arrangement of chuck, substrate and/or other components. Therefore, the exact shape of the ceramic plate 135, the cooling plate 110 and the heater plate 130 as shown in FIGS. 2, 6-8 and 10 are shown for illustration purposes only and are not limiting in any way. It can also be appreciated that, if desired, the elastomer band 250 can be placed around a substrate support 100 prior to the substrate support 100 being completely assembled. In other words, elastomer band 250 can be placed around a substrate support 100 when ceramic plate 135 is an upper surface of substrate support 100 or when heater plate 130 is an upper surface of substrate support 100. For example, elastomer band 250 can be installed around substrate support 100 prior to ceramic layer 135 being installed on the substrate support 100. Accordingly, installation fixture 150 can be disposed over heater plate 130 as the upper surface of substrate support 100, which typically has a smaller diameter than ceramic plate 135. In such a case, inner diameter 112 of installation fixture 150 is equal to or greater than the diameter of heater plate 130.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. An annular installation fixture adapted to mount an elastomer band in a mounting groove around a semiconductor substrate support used for supporting a semiconductor substrate in a plasma processing chamber, the annular installation fixture comprising:
   an inner portion adapted to be located above an outer portion of an upper surface of the semiconductor substrate support;
   a vertically extending portion adapted to receive the elastomer band; and
   a plurality of radially extending portions extending outward from the vertical extending portion and adapted to receive a plurality of mechanical fasteners at locations corresponding to mounting holes in the semiconductor substrate support.

2. The annular installation fixture of claim 1, wherein the vertically extending portion has an angled tip at a free end thereof.

3. The annular installation fixture of claim 1, wherein the annular installation fixture is comprised of plastic, quartz, ceramic, metal or silicon.

4. The annular installation fixture of claim 1, wherein the annular installation fixture is comprised of plastic.

5. The annular installation fixture of claim 4, wherein the plastic comprises a fluorocarbon.

6. An elastomer band installation kit comprising:
   a) an annular installation fixture adapted to mount an elastomer band in a mounting groove around a semiconductor substrate support, the annular installation fixture comprising:
      an inner portion adapted to be located above an upper surface of the semiconductor substrate support;
      a vertically extending portion adapted to receive the elastomer band; and
      a plurality of radially extending portions comprising through-holes adapted to receive mechanical fasteners at locations corresponding to mounting holes in the semiconductor substrate support;
   b) a curved embedding tool adapted to press the elastomer band into the mounting groove in the semiconductor substrate support, the tool comprising two opposing surfaces that are curved in a concave manner, wherein one curved surface comprises a recess at an inner portion thereof with radially extending portions at outer portions thereof, each radially extending portion comprising a projection; and wherein the opposing curved surface comprises a series of equilaterally spaced indentations; and
   c) a plurality of mechanical fasteners each adapted to fit through through-holes of the semiconductor substrate support and through the through-holes of the annular installation fixture.

7. The elastomer band installation kit of claim 6, wherein the vertically extending portion of the annular installation fixture has an angled tip.

8. The elastomer band installation kit of claim 6, wherein the annular installation fixture is comprised of a low-friction plastic material.

9. The elastomer band installation kit of claim 6, wherein the annular installation fixture is comprised of polyethylene terephthalate (PET) or polytetrafluoroethylene (PTFE).

10. The elastomer band installation kit of claim 6, wherein the curved embedding tool is comprised of polyetheretherketon (PEEK) or polytetrafluorothylene (PTFE).

11. The annular installation fixture of claim 1, wherein the inner portion has a pair of recesses, which are configured to assist with alignment of annular installation fixture with respect to the semiconductor substrate support.

12. The annular installation fixture of claim 11, comprising:
   an un-recessed portion of the inner portion configured to contact an outer periphery of a ceramic layer of the semiconductor substrate support.

13. The annular installation fixture of claim 1, wherein the inner portion comprises a horizontal protrusion extending radially inward.

14. The annular installation fixture of claim 1, wherein the plurality of radially extending portions comprises four radially extending portions disposed about 72 degrees to about 108 degrees from a neighboring radially extending portion.

15. An annular installation fixture adapted to mount an elastomer band in a mounting groove around a semiconductor substrate support used for supporting a semiconductor substrate in a plasma processing chamber, the annular installation fixture comprising:
   an inner portion adapted to be located above an outer portion of an upper surface of the semiconductor substrate support;
   a vertically extending portion adapted to receive the elastomer band;
   a plurality of radially extending portions adapted to receive a plurality of mechanical fasteners at locations corresponding to mounting holes in the semiconductor substrate support; and
   wherein annular installation fixture is an annular ring.

16. The annular installation fixture of claim 15, wherein the annular ring has an inner diameter at an innermost surface of about 10.5 to about 11.5 inches and an outer diameter at an outermost surface of the vertically extending portion of about 11.0 to about 12.0 inches.

17. The elastomer band installation kit of claim 6, wherein the inner portion has a pair of recesses, which are configured to assist with alignment of annular installation fixture with respect to the semiconductor substrate support.

18. The elastomer band installation kit of claim 6,
   an un-recessed portion of the inner portion configured to contact an outer periphery of a ceramic layer of the semiconductor substrate support.

19. The elastomer band installation kit of claim 6, wherein the inner portion comprises a horizontal protrusion extending radially inward.

20. The elastomer band installation kit of claim 6, wherein the plurality of radially extending portions comprises four radially extending portions disposed about 72 degrees to about 108 degrees from a neighboring radially extending portion.

* * * * *